(12) United States Patent
Park et al.

(10) Patent No.: US 11,164,833 B2
(45) Date of Patent: Nov. 2, 2021

(54) SEMICONDUCTOR DEVICE USING WIRES AND STACKED SEMICONDUCTOR PACKAGE

(71) Applicant: SK hynix Inc., Icheon-si (KR)

(72) Inventors: Young Jo Park, Yongin-si (KR); Seung Yeop Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/835,980

(22) Filed: Mar. 31, 2020

(65) Prior Publication Data

US 2021/0104479 A1     Apr. 8, 2021

(30) Foreign Application Priority Data

Oct. 4, 2019  (KR) .................. 10-2019-0122846

(51) Int. Cl.
*H01L 23/00* (2006.01)
*H01L 25/065* (2006.01)

(52) U.S. Cl.
CPC .............. *H01L 24/06* (2013.01); *H01L 24/48* (2013.01); *H01L 25/0657* (2013.01); *H01L 24/49* (2013.01); *H01L 2224/04042* (2013.01); *H01L 2224/06131* (2013.01); *H01L 2224/48091* (2013.01); *H01L 2224/48106* (2013.01); *H01L 2224/48145* (2013.01); *H01L 2224/48227* (2013.01); *H01L 2224/4912* (2013.01); *H01L 2225/0651* (2013.01); *H01L 2225/06506* (2013.01); *H01L 2225/06562* (2013.01); *H01L 2225/06596* (2013.01)

(58) Field of Classification Search
CPC .................. H01L 25/0657; H01L 2225/06568
See application file for complete search history.

(56) References Cited

U.S. PATENT DOCUMENTS

| 2008/0150111 | A1* | 6/2008 | Hiller | ...................... H01L 24/49 |
| | | | | 257/686 |
| 2010/0187690 | A1* | 7/2010 | Okada | ................. H01L 25/0657 |
| | | | | 257/738 |
| 2018/0005994 | A1* | 1/2018 | Oh | .......................... H01L 25/50 |
| 2018/0145053 | A1* | 5/2018 | Jung | ....................... H01L 24/06 |
| 2020/0006163 | A1* | 1/2020 | Amir | ................... H01L 25/0657 |

FOREIGN PATENT DOCUMENTS

| JP | 2012-018988 A | 1/2012 |
| KR | 10-0155440 B1 | 10/1998 |
| KR | 10-2003-0089462 A | 11/2003 |
| KR | 10-2012-0002761 A | 1/2012 |

* cited by examiner

*Primary Examiner* — Yu-Hsi D Sun

(57) ABSTRACT

Disclosed are a semiconductor device and a stacked semiconductor package. The semiconductor device may include a semiconductor chip and a plurality of chip pads disposed on the semiconductor chip in a second horizontal direction perpendicular to a first horizontal direction. The plurality of chip pads may include: a first chip pad connected to a wire extending in the first horizontal direction, when seen from the top; and a second chip pad connected to a diagonal wire extending in a direction at an angle to the first and second horizontal directions, when seen from the top. The width of the first chip pad in the second horizontal direction may be smaller than the width of the second chip pad in the second horizontal direction.

16 Claims, 8 Drawing Sheets

FIG.1
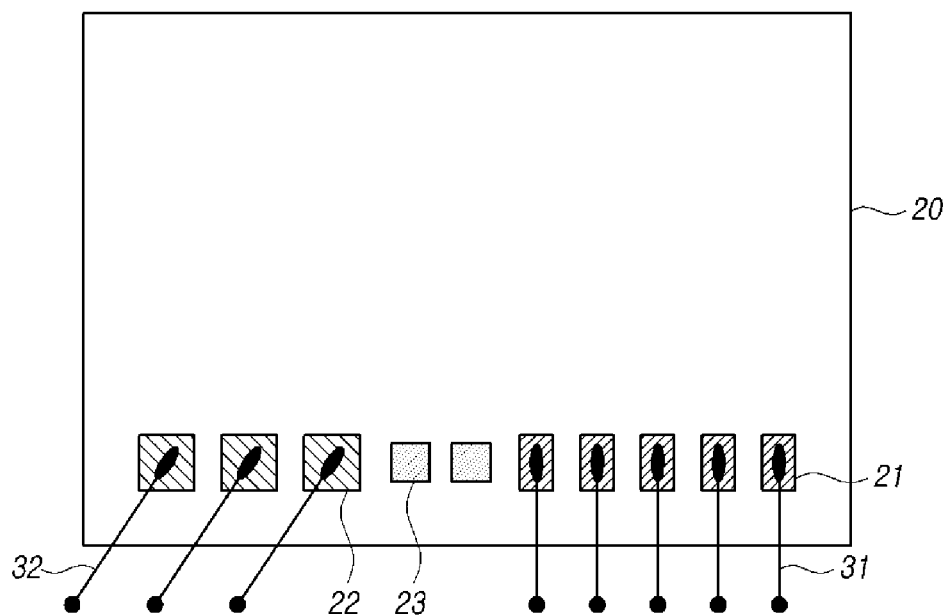
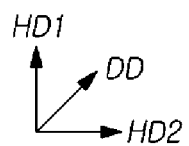

FIG.2
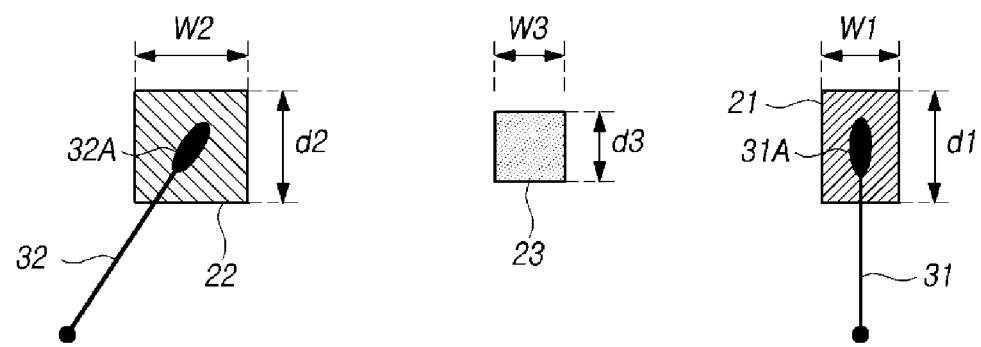
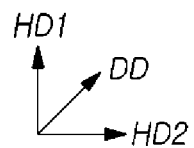

SEMICONDUCTOR DEVICE USING WIRES AND STACKED SEMICONDUCTOR PACKAGE

CROSS-REFERENCE TO RELATED APPLICATION

The present application claims priority 35 U.S.C. § 119(a) to Korean Patent Application No. 10-2019-0122846 filed in the Korean Intellectual Property Office on Oct. 4, 2019, which is incorporated herein by reference in its entirety.

BACKGROUND

1. Field

Exemplary embodiments relate to a semiconductor technology, and more particularly, to a semiconductor device using wires and a stacked semiconductor package.

2. Discussion of the Related Art

With developments in the fabrication process technology of semiconductor devices, semiconductor chips have steadily shrunk in size. However, when various functions are to be supported through one semiconductor chip, the number of required signal inputs/outputs is increased to raise the number of chip pads on the semiconductor chip. However, it is not easy to reduce the size of the chip pads, due to a problem related to the reuse of wire bonding equipment or due to a reduction in bonding force or bonding strength with a bonding wire. For this reason, the rate at which an area occupied by the chip pads is reduced does not keep up with the rate at which the degree of integration of semiconductor devices is increased. Thus, semiconductor chip size may be limited by the size of chip pads.

SUMMARY

Various embodiments are directed to a semiconductor device which can be reduced in size, and a stacked semiconductor package.

In an embodiment, a semiconductor device may include a semiconductor chip; and a plurality of chip pads disposed on the semiconductor chip in a second horizontal direction perpendicular to a first horizontal direction. The plurality of chip pads may include: a first chip pad connected to a wire extending in the first horizontal direction when seen from the top; and a second chip pad connected to a diagonal wire, the diagonal wire extending in a direction at an angle to the first and second horizontal directions, when seen from the top. The width of the first chip pad in the second horizontal direction may be smaller than the width of the second chip pad in the second horizontal direction.

In an embodiment, a stacked semiconductor package may include: a substrate; and a plurality of semiconductor chips stacked over the substrate, each having a pad unit in which a first chip pad and a second chip pad are disposed, and offset from each other in a first horizontal direction such that the pad units are exposed. The first chip pads of the semiconductor chips may be connected to a wire extending in the first horizontal direction, when seen from the top, and one or more of the second chip pads of the semiconductor chips may be connected to a diagonal wire extending in a direction at angles to the first horizontal direction and a second horizontal direction perpendicular to the first horizontal direction, when seen from the top. The width of the first chip pad in the second horizontal direction may be smaller than the width of the second chip pad in the second horizontal direction.

BRIEF DESCRIPTION OF THE DRAWINGS

FIG. 1 is a plan view illustrating a semiconductor device in accordance with an embodiment of the disclosure.

FIG. 2 is an expanded plan view illustrating first to third chip pads of FIG. 1 and wires connected thereto.

DETAILED DESCRIPTION

Figure 3:
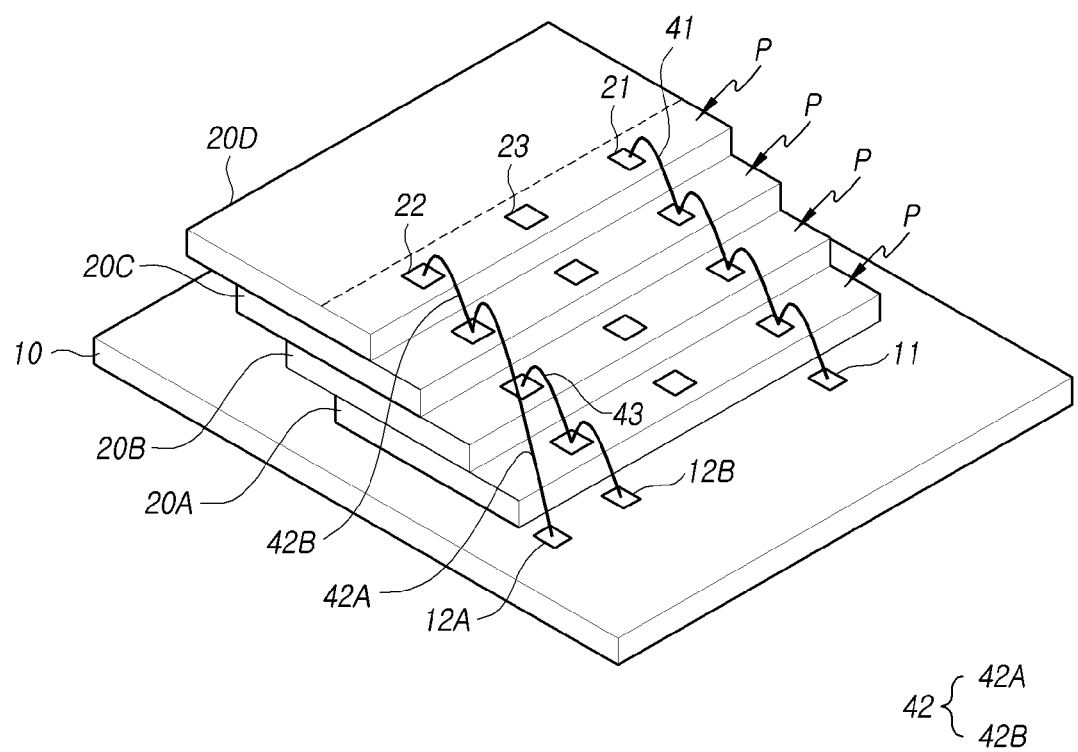
FIG. 3 is a perspective view illustrating a stacked semiconductor package in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise.

Elements in embodiments of the disclosure should be interpreted as including error margins even in the absence of explicit statements.

Also, in describing the elements of the disclosure, there may be terms used like first, second, A, B, (a), and (b). These are solely for the purpose of differentiating one element from the other and do not to imply or suggest the substances, order, sequence or number of the elements. Also, elements in embodiments of the disclosure are not limited by these terms. These terms are used to merely distinguish one element from another. Accordingly, as used herein, a first element may be a second element within the technical spirit of the disclosure.

If an element is described as "connected," "coupled" or "linked" to another element, the element may be directly "connected," "coupled" or "linked," but still another element is interposed therebetween or the respective elements may be indirectly "connected," "coupled" or "linked" via a third element. In describing positional relationship, such as "an element A on an element B," "an element A above an element B," "an element A below an element Bi" and "an element A next to an element B," another element C may be disposed between the elements A and B unless the term "directly" or "immediately" is explicitly used. When a positional relationship is described, for example, when a positional relationship between two elements, such as 'on', 'over', 'under' or 'beside' is described, one or more other elements may be located between two elements, as long as a term such as 'directly' or 'immediately' is not used.

Also, features of various exemplary embodiments of the disclosure may be coupled, combined or separated partially or totally. Technically various interactions and operations are possible. Various exemplary embodiments can be carried out individually or in combination.

Hereinafter, embodiments of the disclosure will be described in detail with reference to the accompanying drawings. In the accompanying drawings, two directions that are substantially parallel to the top surface of a substrate and intersect with each other are defined as a first horizontal direction HD1 and a second horizontal direction HD2, respectively, and a direction that vertically protrudes from the top surface of the substrate is defined as a vertical direction VD. The first horizontal direction HD1 and second horizontal direction HD2 may substantially perpendicularly intersect with each other to form a plane substantially parallel to the top surface of the substrate, and diagonal direction DD may be intersect with first horizontal direction HD1 and second horizontal direction HD2 at an angle on the same plane. The vertical direction VD may correspond to a direction that is perpendicular to the first horizontal direction HD1 and the second horizontal direction HD2. In the drawings, a direction indicated by an arrow and a direction opposite thereto represent the same direction.

FIG. 1 is a plan view illustrating a semiconductor device in accordance with an embodiment of the disclosure. FIG. 2 is an expanded plan view illustrating first to third chip pads of FIG. 1 and wires connected thereto.

Referring to FIG. 1, a semiconductor chip 20 includes a plurality of chip pads 21 to 23 provided at one end thereof in a first horizontal direction HD1. The chip pads 21 to 23 may be arranged at the one end of the semiconductor chip 20 in a second horizontal direction HD2, and serve as contacts of the semiconductor chip 20 for connection with an external device. The first horizontal direction HD1 and the second horizontal direction HD2 may correspond to directions which cross each other at substantially right angles while forming a plane substantially parallel to the top surface of the semiconductor chip 20. FIG. 1 illustrates chip pads 21 to 23 are disposed in one column in second horizontal direction in the HD2, but embodiments contemplated by the disclosure are not limited thereto, and the chip pads 21 to 23 may be disposed in two or more columns.

The chip pads 21 to 23 may be classified into first chip pads 21, second chip pads 22 and third chip pads 23. The first chip pads 21 are connected to straight wires 31, and the second chip pads 22 are connected to diagonal wires 32. The third chip pads 23, which are not connected to the wires, may correspond to test pads which are used when the semiconductor chip 20 is tested, but not used after the semiconductor chip 20 undergoes packaging.

In a top view, the straight wire 31 may be extended in the first horizontal direction HD1. In addition, the diagonal wire 32 may be extended in a diagonal direction DD tilted at an angle with respect to the first and second horizontal directions HD1 and HD2 in a top view.

Referring to FIG. 2, the straight wire 31 in the first horizontal direction HD1 may be bonded to the first chip pad 21. Thus, a contact part 31A of the straight wire 31, bonded to the top surface of the first chip pad 21, may have an elliptical shape with the major axis substantially parallel to the first horizontal direction HD1. The diagonal wire 32 is bonded to the second chip pad 22 in the diagonal direction DD. Thus, a contact part 32A of the diagonal wire 32 bonded to the top surface of the second chip pad 22 may have an elliptical shape with the major axis substantially parallel to the diagonal direction DD.

In order to secure the bonding with the wires 31 and 32, the first and second chip pads 21 and 22 need to have sufficient size so that the contact parts 31A and 32A of the wires 31 and 32 can be landed. Since a large number of chip pads 21 to 23 are disposed on the semiconductor chip 20 to support various functions, the areas of the chip pads 21 to 23 need to be reduced in order to decrease the overall size of the semiconductor chip 20. In particular, the widths of the chip pads 21 to 23 must be reduced in the second horizontal direction HD2, which corresponds to the arrangement direction of the chip pads 21 to 23.

Since the contact part 32A of the diagonal wire 32 has an elliptical shape with the major axis in the diagonal direction DD tilted with respect to the first and second horizontal directions HD1 and HD2, the width w2 of the second chip pad 22 in the second horizontal direction HD2 may be set to substantially the same value as the length d2 of the second chip pad 22 in the first horizontal direction HD1, such that the contact part 32A of the diagonal wire 32 can be landed on the second chip pad 22. For example, the second chip pad 22 may have a square shape whose width w2 and length d2 are 60 μm.

The width w1 of the first chip pad 21 may be set to a smaller value than the width w2 of the second chip pad 22. For example, the width w2 of the second chip pad 22 may be set to 60 μm, and the width w1 of the first chip pad 21 may be set to 55 μm. Since the contact part 31A of the straight wire 31 has an elliptical shape with the major axis in the first horizontal direction HD1, the contact part 31A of the straight wire 31 can be landed on the first chip pad 21 even though the width w1 of the first chip pad 21 is smaller than the width w2 of the second chip pad 22. The length d1 of the first chip pad 21 in the first horizontal direction HD1 may be substantially equal to the length d2 of the second chip pad 22. For example, the first chip pad 21 may have a rectangular shape whose width w1 and length d1 are 55 μm and 60 μm, respectively.

During a chip test process, a probe needle of test equipment is connected to the third chip pad 23 to input/output a necessary test signal, and the test equipment determines whether the semiconductor chip 20 is defective, based on a read result for the output signal. For a normal test, the size of the third chip pad 23 needs to be large enough to prevent a defective contact with the probe needle. However, as the thickness of the probe needle is reduced with the development of the improved test equipment, the area of the third chip pad 23, which is required for contact with the probe needle, may be reduced. Therefore, when the third chip pad 23 has the same size as the second chip pad 22, the size of the third chip pad 23 may serve as a limit on the size of the semiconductor chip 20.

In some embodiments, the third chip pad 23 may have a smaller size than the second chip pad 22. The width w3 of the third chip pad 23 may be smaller than the width w2 of the second chip pad 22, and the length d3 of the third chip pad 23 may be smaller than the length d2 of the second chip pad 22. For example, the second chip pad 22 may have a square shape whose width w2 and length d2 are 60 μm, and the third chip pad 23 may have a square shape whose width w3 and length d3 are 55 μm.

Figure 4:
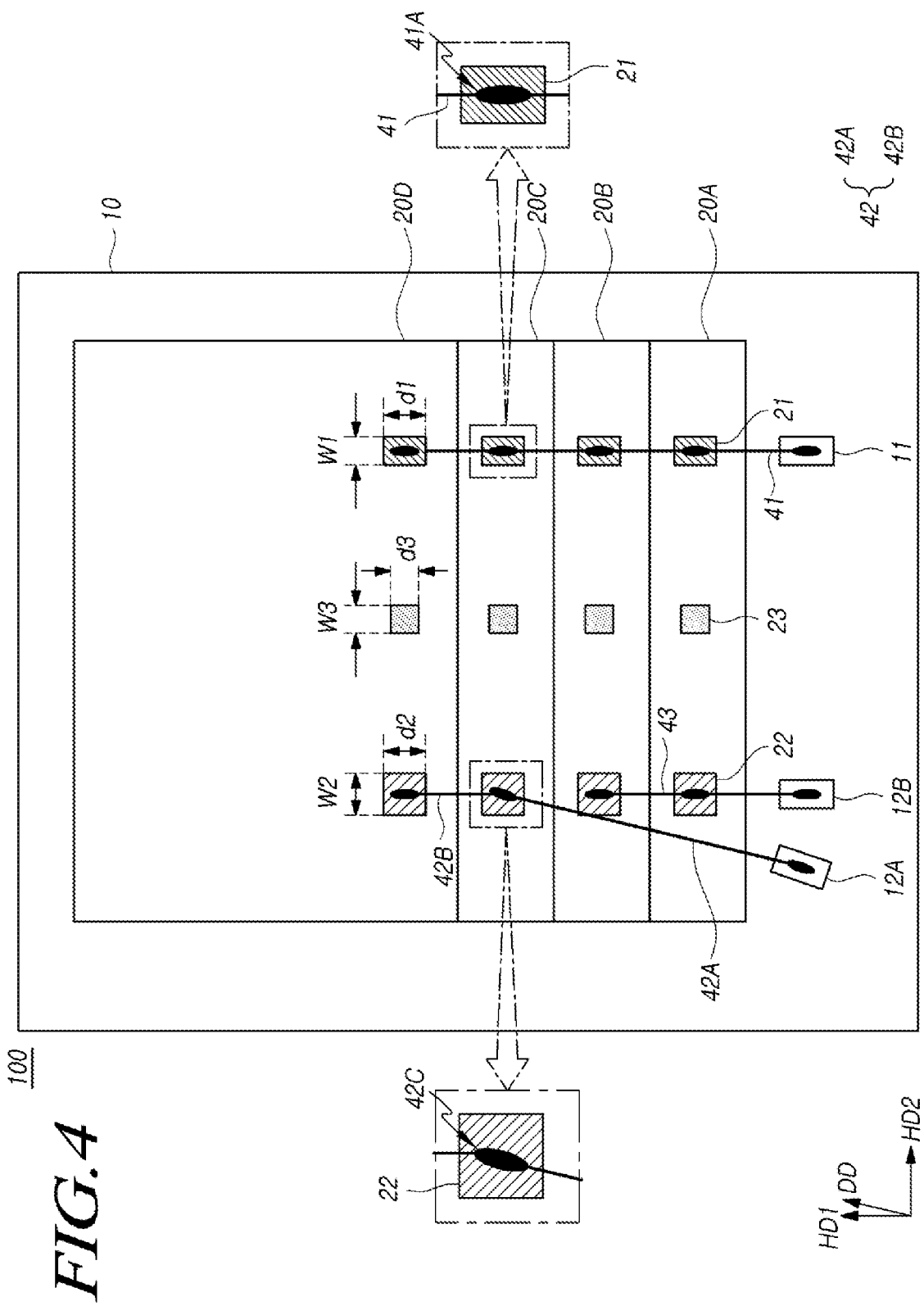
FIG. 4 is a plan view of the stacked semiconductor package illustrated in FIG. 3.

FIG. 3 is a perspective view illustrating a stacked semiconductor package in accordance with an embodiment of the disclosure, and FIG. 4 is a plan view of the stacked semiconductor package illustrated in FIG. 3.

Referring to FIGS. 3 and 4, a stacked semiconductor package 100 in accordance with an embodiment may have a structure in which a plurality of semiconductor chips 20A to 20D are stacked over a substrate 10 having a plurality of bonding fingers 11, 12A and 12B. The semiconductor chips 20A to 20D may be the same kind of chips. In the present embodiment, the semiconductor chips 20A to 20D are flash memory chips. However, the present embodiment is not limited thereto. The semiconductor chips 20A to 20D may be different types of memory chips or non-memory chips in other embodiments contemplated by the disclosure.

The semiconductor chips 20A to 20D may be fabricated on a single wafer using the same process steps, and may have the same structure. Each of the semiconductor chips 20A to 20D may include a pad unit P provided at an edge thereof in the first horizontal direction HD1, the pad unit P having a plurality of chip pads 21 to 23 located therein. The pad unit P may be elongated in the second horizontal direction HD2 perpendicular to the first horizontal direction HD1.

The chip pads 21 to 23 may be arranged in the pad unit P in the second horizontal direction HD2. The chip pads 21 to 23 may be classified into the first chip pads 21, the second chip pads 22 and the third chip pads 23. For simplification of illustration, FIGS. 3 and 4 illustrate that one first chip pad 21, one second chip pad 22 and one third chip pad 23 are disposed on each of the semiconductor chips 20A to 20D. In reality, however, a plurality of first chip pads 21, a plurality of second chip pads 22 and a plurality of third chip pads 23 may be located on each of the semiconductor chips 20A to 20D.

The semiconductor chips 20A to 20D may be stacked with an offset in the first horizontal direction HD1, such that the pad units P of each of semiconductor chips 20A to 20D are exposed. In a top view, the first chip pads 21 of the semiconductor chips 20A to 20D may be disposed in a line in the first horizontal direction HD1. Similarly, the second chip pads 22 and the third chip pads 23 of the semiconductor chips 20A to 20D may also be disposed in a line in the first horizontal direction HD1 in a top view.

The first chip pads 21 of the semiconductor chips 20A to 20D, which are disposed in a line in the first horizontal direction HD1, may be connected to the first bonding finger 11, which formed in or disposed on the substrate 10, through a first wire 41. In a top view, the first wire 41 may be extend in the first horizontal direction HD1, and may sequentially connect to the first bonding finger 11 of the substrate 10 and the first chip pads 21 of the semiconductor chips 20A to 20D. To connect the first bonding finger and semiconductor chips 20D to 20A, the first wire 41 may also travel upward or downward in vertical direction VD while extending in the first horizontal direction HD1.

The same signal may be inputted to each of the first chip pads 21 disposed in a line in the first horizontal direction HD1 through the first wire 41. The first chip pad 21 may include a data input/output pad through which data are input or output. Data inputted through the first bonding finger 11 of the substrate 10 may be commonly inputted to the first chip pads 21 of the semiconductor chips 20A to 20D through the first wire 41, and data outputted from the first chip pads 21 of the semiconductor chips 20A to 20D may be outputted to the first bonding finger 11 of the substrate 10 through the first wire 41.

The first chip pad 21 may serve as a command input pad for inputting a command to the semiconductor chips 20A to 20D, or as an address input pad for inputting an address to the semiconductor chips 20A to 20D. The first chip pad 21 may serve as a supply voltage pad for inputting a supply voltage Vcc to the semiconductor chips 20A to 20D, or as a ground voltage pad for inputting a ground voltage Vss to the semiconductor chips 20A to 20D.

The stacked semiconductor package 100 may have a multi-channel structure for transmitting signals using a plurality of channels. The semiconductor chips 20A to 20D included in the stacked semiconductor package 100 may be divided into a plurality of channel groups. For example, two semiconductor chips 20C and 20D located at or near the top of a stack may be included in a first channel group, and two semiconductor chips 20A and 20B located at or near the bottom of a stack may be included in a second channel group. The second chip pads 22 of the semiconductor chips 20A to 20D may correspond to chip pads for signal transmission, and may be connected to different bonding fingers for different channel groups.

Different signals may be input into the second chip pads 22 of the semiconductor chips 20A to 20D for respective channel groups. For example, a first signal may be inputted to the second chip pads 22 of the semiconductor chips 20C and 20D belonging to the first channel group, while a second signal may be inputted to the second chip pads 22 of the semiconductor chips 20A and 20B belonging to the second channel group.

The second chip pads 22 of the semiconductor chips 20C and 20D belonging to the first channel group may be connected to a second bonding finger 12A disposed in or on the substrate 10 through a second wire 42. The second chip pads 22 of the semiconductor chips 20A and 20B belonging to the second channel group may be connected to a third bonding finger 12B disposed in or on the substrate 10 through a third wire 43.

In a top view, the second bonding finger 12A of the substrate 10 may be located so as not to be disposed in a line with the second chip pads 22 of the semiconductor chips 20A to 20D in the first horizontal direction HD1. For example, second bonding finger 12A may be offset from a line of second chip pads 22 in the second horizontal direction HD2. In such instances, at least a part of the second wire 42 may be extended in the diagonal direction DD, tilted with respect to the first and second horizontal directions HD1 and HD2, when seen in a top view. For example, the second wire 42 may include a first part 42A connecting the second bonding finger 12A of the substrate 10 and the second chip pad 22 of the semiconductor chip 20C, and a second part 42B connecting the second chip pad 22 of the semiconductor chip 20C and the second chip pad 22 of the semiconductor chip 20D. The first part 42A of the second wire 42 may be extended in the diagonal direction DD in a top view.

In a top view, the third bonding finger 12B of the substrate 10 may be disposed in a line with the second chip pads 22 of the semiconductor chips 20A to 20D in the first horizontal direction HD1. In a top view, the third wire 43 may be extended in the first horizontal direction HD1. In an embodiment, the wire 42A connecting the second bonding finger 12A of the substrate 10 and the second chip pad 22 of the semiconductor chip 20C corresponds to a diagonal wire, and while other wires correspond to straight wires, i.e., wires parallel to first horizontal direction HD1 in a top view.

Referring to FIG. 4, the wire 42A is bonded to the second chip pad 22 of the semiconductor chip 20C in the diagonal direction DD. Thus, a contact part 42C of the wire 42A bonded to a top surface of the second chip pad 22 of the semiconductor chip 20C may have an elliptical shape with the major axis in a substantially diagonal direction DD. The first wire 41 may be bonded to the first chip pads 21 of the semiconductor chips 20A to 20D in the first horizontal direction HD1. Thus, a contact part 41A of the first wire 41 bonded to the top surface of the first chip pad 21 may have an elliptical shape with the major axis parallel to the first horizontal direction HD1.

In order to secure the bonding between the second chip pad 22 of the semiconductor chip 20C and the second wire 42A, the width w2 of the second chip pad 22 in the second horizontal direction HD2 may be set to substantially the same value as the length d2 of the second chip pad 22 in the first horizontal direction HD1. For example, the second chip pad 22 may have a square shape whose width w2 and length d2 are 60 μm.

The width w1 of the first chip pad 21 may be smaller than the width w2 of the second chip pad 22. For example, the width w2 of the second chip pad 22 may be set to 60 μm, and the width w1 of the first chip pad 21 may be set to 55 μm. Since the contact part 41A of the first wire 41 has an elliptical shape with the major axis in the first horizontal direction HD1, the contact part 41A of the first wire 41 can be landed on the first chip pad 21, even though the width w1 of the first chip pad 21 is set to a smaller value than the width w2 of the second chip pad 22. The length d1 of the first chip pad 21 in the first horizontal direction HD1 may be substantially equal to the length d2 of the second chip pad 22. For example, the first chip pad 21 may have a rectangular shape whose width w1 and length d1 are 55 μm and 60 μm, respectively.

The third chip pad 23, which does not need to be connected to a wire, may correspond to a test pad which is used during a chip test. The third chip pad 23 may have a smaller size than the second chip pad 22. The width w3 of the third chip pad 23 may be smaller than the width w2 of the second chip pad 22, and the length d3 of the third chip pad 23 may be smaller than the length d2 of the second chip pad 22. For example, the second chip pad 22 may have a square shape whose width w2 and length d2 are 60 μm, and the third chip pad 23 may have a square shape whose width w3 and length d3 are 55 μm.

Figure 5:
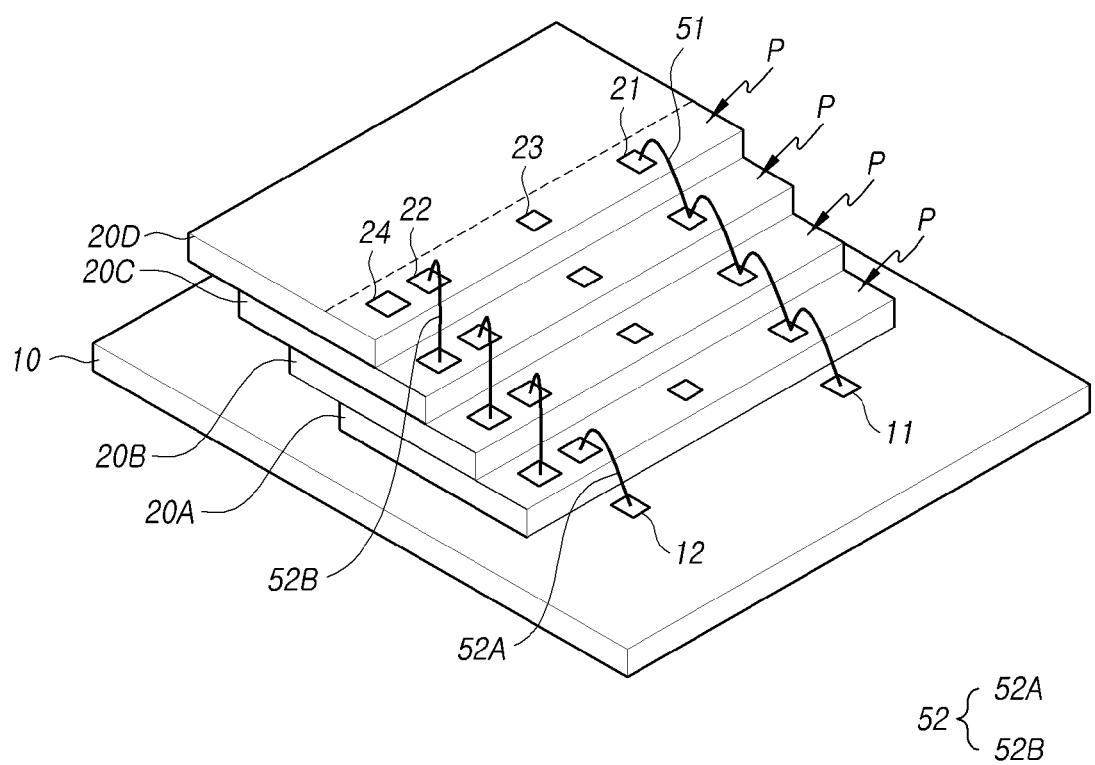
FIG. 5 is a perspective view illustrating a stacked semiconductor package in accordance with an embodiment of the disclosure.
Figure 6:
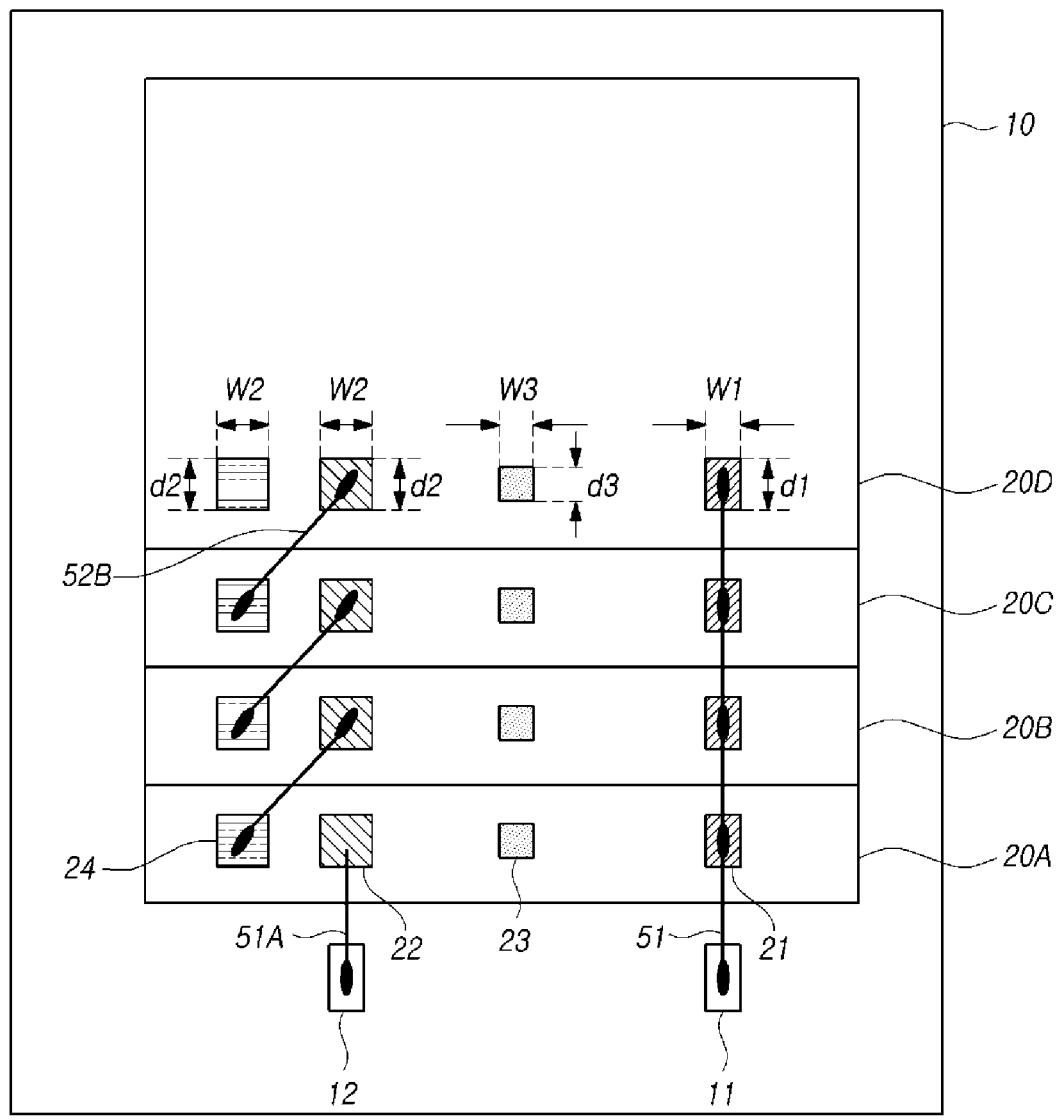
FIG. 6 is a plan view of the stacked semiconductor package illustrated in FIG. 5.

FIG. 5 is a perspective view illustrating a stacked semiconductor package in accordance with an embodiment of the disclosure. FIG. 6 is a plan view of the stacked semiconductor package illustrated in FIG. 5.

Referring to FIGS. 5 and 6, a stacked semiconductor package 200 in accordance with an embodiment may have a structure in which a plurality of semiconductor chips 20A to 20D are stacked in a vertical direction VD over a substrate 10 having a plurality of bonding fingers 11 and 12.

The semiconductor chips 20A to 20D may be fabricated on a single wafer using the same process steps, and have substantially the same structure. Each of the semiconductor chips 20A to 20D may include a pad unit P provided at an edge thereof in the first horizontal direction HD1, the pad unit P having a plurality of chip pads 21 to 24. The pad unit P may be elongated in the second horizontal direction HD2, which is substantially perpendicular to the first horizontal direction HD1.

The chip pads 21 to 24 may be disposed in or on the pad unit P in the second horizontal direction HD2. The chip pads 21 to 24 may be classified into first chip pads 21, second chip pads 22, third chip pads 23 and fourth chip pads 24. For simplification of illustration, FIGS. 5 and 6 illustrate one first chip pad 21, one second chip pad 22, one third chip pad 23 and one fourth chip pad 24 disposed in or on a pad unit P of each of the semiconductor chips 20A to 20D. In reality, however, a plurality of first chip pads 21, a plurality of second chip pads 22, a plurality of third chip pads 23 and a plurality of fourth chip pads 24 may be present in each of the semiconductor chips 20A to 20D.

The semiconductor chips 20A to 20D may be stacked with an offset or staggered in the first horizontal direction HD1, such that the pad units P are exposed. In a top view, the first chip pads 21 of the semiconductor chips 20A to 20D may be disposed in a line in the first horizontal direction HD1. The second chip pads 22 of the semiconductor chips 20A to 20D may also be disposed in a line in the first horizontal direction HD1. Similarly, in a top view, the other third and fourth chip pads 23 and 24 may also be disposed in a line in the first horizontal direction HD1.

The first chip pads 21 of the semiconductor chips 20A to 20D, which are disposed in a line in the first horizontal direction HD1, may be connected to the first bonding finger 11, formed in or on the substrate 10, through a first wire 51. In a top view, the first wire 51 is seen to be extended in the first horizontal direction HD1, and to sequentially connected to the first bonding finger 11 of the substrate 10 to the first chip pads 21 of the semiconductor chips 20A to 20D, while running upward or downward in the vertical direction VD.

The same signal may be inputted to the first chip pads 21, disposed in a line in the first horizontal direction HD1, through the first wire 51. The first chip pad 21 may include an input/output pad. Data inputted through the first bonding finger 11 of the substrate 10 may be commonly inputted to the first chip pads 21 of the semiconductor chips 20A to 20D through the first wire 51, and data outputted from the first chip pads 21 of the semiconductor chips 20A to 20D may be outputted to the first bonding finger 11 of the substrate 10 through the first wire 51. A command or address inputted through the first bonding finger 11 of the substrate 10 may be commonly inputted the first chip pads 21 of the semiconductor chips 20A to 20D through the first wire 51.

The second chip pad 22 of the lowermost semiconductor chip 20A may be connected to the second bonding finger 12 of the substrate 10 through a straight wire 52A. Each of the second chip pads 22 included in the semiconductor chips 20B to 20D may be connected to a respective fourth chip pad 24 of another semiconductor chip through a diagonal wire 52B.

The semiconductor chips 20A to 20D may be distinguished from each other by chip addresses. The semiconductor chips 20A to 20D may not include pads for storing chip addresses, and instead may store chip addresses in internal memory regions thereof. In order to store chip addresses that are different from each other, the semiconductor chips 20A to 20D may include an enable input pad and an enable output pad. The second chip pad 22 may correspond to an enable input pad, and the fourth chip pad 24 may correspond to an enable output pad. According to signals applied to the second chip pads 22 and the fourth chip pads 24, the chip addresses may be sequentially stored in the semiconductor chips 20A to 20D. For example, a logic high signal may be applied to the second chip pad 22 of the lowermost semiconductor chip 20A from the second bonding finger 12 of the substrate 10. In this state, when a chip address is inputted to the first chip pads 21 of the semiconductor chips 20A to 20D, the chip address may be stored in the lowermost semiconductor chip 20A. When the chip address is completely stored in the lowermost semiconductor chip 20A, an output signal of the fourth chip pad 24 of the lowermost semiconductor chip 20A transitions from logic low to logic high, and no more chip addresses are stored in the lowermost semiconductor chip 20A.

When the signal of the fourth chip pad 24 of the lowermost semiconductor chip 20A transitions to logic high, a logic high signal is applied to the second chip pad 22 of the semiconductor chip 20B, connected to the fourth chip pad 24 of the lowermost semiconductor chip 20A through the diagonal wire 52, such that the semiconductor chip 20B is ready to store an address. Then, when a chip address is inputted to the first chip pads 21 of the semiconductor chips 20A to 20D, the chip address may be stored in the semiconductor chip 20B. When the chip address is completely stored in the semiconductor chip 20B, an output signal of the fourth chip pad 24 of the semiconductor chip 20B transitions from logic low to logic high, and no more chip addresses are stored in the semiconductor chip 20B. In this way, the chip addresses may be sequentially stored in the semiconductor chips 20A to 20D.

In order to secure the bonding with the diagonal wire 52B, the width w2 of the second chip pads 22 and the fourth chip pads 24 of the semiconductor chips 20A to 20D in the second horizontal direction HD2 may be substantially equal to the length d2 thereof in the first horizontal direction HD1.

The width w1 of the first chip pad 21 may be smaller than the width w2 of the second chip pad 22, and the length d1 of the first chip pad 21 may be substantially equal to the length d2 of the second chip pad 22.

The third chip pad 23, which does not need to be connected to a wire, may correspond to a test pad which is used during a chip test. The third chip pad 23 may have a smaller size than the second chip pad 22. The width w3 of the third chip pad 23 may be smaller than the width w2 of the second chip pad 22, and the length d3 of the third chip pad 23 may be smaller than the length d2 of the second chip pad 22.

In accordance with embodiments disclosed herein, the width of chip pads connected to a straight wire may be set to a smaller value than the width of chip pads connected to a diagonal wire, such that an area occupied by the chip pads can be reduced without a reduction in bonding force or strength with the wires. Therefore, it is possible to reduce the size of the semiconductor chips.

The above-described semiconductor devices and stacked semiconductor packages may be used in various semiconductor devices and package modules.

Figure 7:
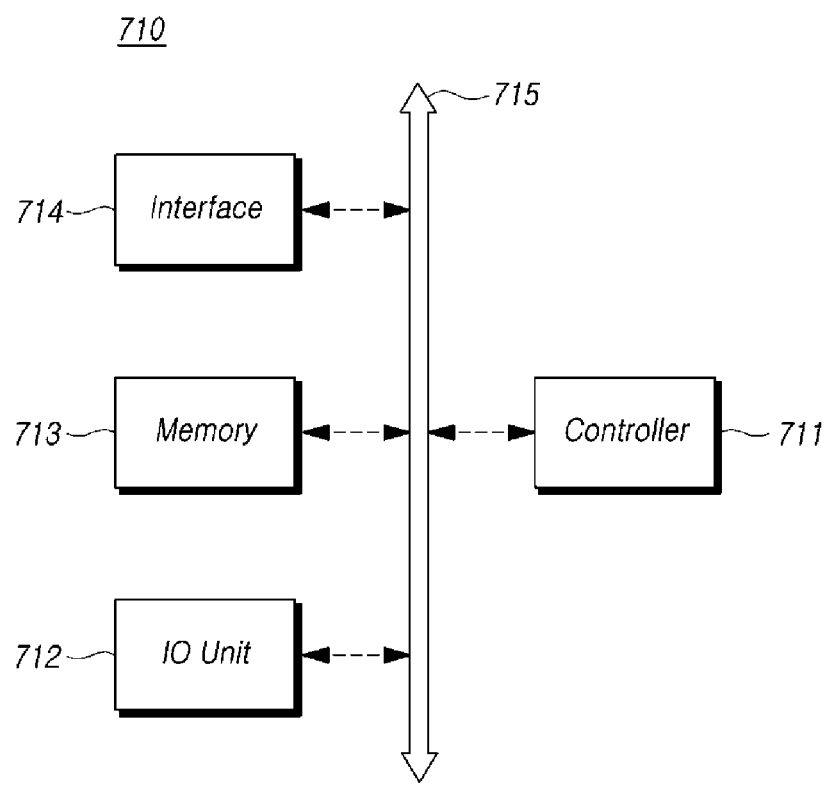
FIG. 7 is a block diagram illustrating an electronic system including a semiconductor device or stacked semiconductor package in accordance with an embodiment of the disclosure.
Figure 8:
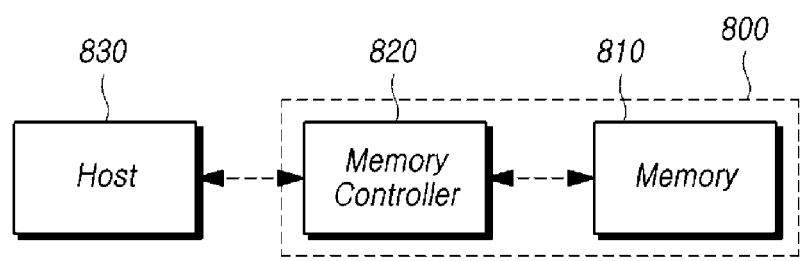
FIG. 8 is a block diagram illustrating a memory card including a semiconductor device or stacked semiconductor package in accordance with an embodiment of the disclosure.

FIG. 7 is a block diagram illustrating an electronic system including a semiconductor device or stacked semiconductor package in accordance with an embodiment of the disclosure. FIG. 8 is a block diagram illustrating a memory card including a semiconductor device or stacked semiconductor package in accordance with an embodiment of the disclosure.

Referring to FIG. 7, a semiconductor device or stacked semiconductor package in accordance with the embodiments described herein may be used in an electronic system 710. The electronic system 710 may include a controller 711, an input/output unit 712, and a memory 713. The controller 711, the input/output unit 712 and the memory 713 may be electrically coupled with one another through a bus 715 which provides a data movement path.

For example, the controller 711 may include at least one microprocessor, at least one digital signal processor, at least one microcontroller, and at least one of logic circuits capable of performing the same functions as these components. The memory 713 may include at least one of a semiconductor device or a stacked semiconductor package in accordance with disclosed embodiments. The input/output unit 712 may include at least one selected among a keypad, a keyboard, a display device, a touch screen, and so forth. The memory 713 as a device for storing data may store data or/and commands to be executed by the controller 711 or the like.

The memory 713 may include a volatile memory device such as a DRAM or/and a nonvolatile memory device such as a flash memory. For example, the flash memory may be mounted to a mobile terminal or an information processing system such as a desktop computer. The flash memory may be configured by an SSD (solid state drive). In this case, the electronic system 710 may stably store a large amount of data in a flash memory system.

The electronic system 710 may further include an interface 714 which is set to be able to transmit and receive data to and from a communication network. The interface 714 may be a wired or wireless type. For example, the interface 714 may include an antenna, a wired transceiver or a wireless transceiver.

The electronic system 710 may be understood as a mobile system, a personal computer, a computer for an industrial use or a logic system which performs various functions. For example, the mobile system may be any one among a personal digital assistant (PDA), a portable computer, a tablet computer, a mobile phone, a smart phone, a wireless phone, a laptop computer, a memory card, a digital music system and an information transmission/reception system.

In the case where the electronic system 710 is a device capable of performing wireless communication, the electronic system 710 may be used in a communication system such as CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

Referring to FIG. 8, a semiconductor device or stacked semiconductor package in accordance with embodiments disclosed herein may be provided in the form of a memory card 800. For example, the memory card 800 may include a memory 810 such as a nonvolatile memory device and a memory controller 820. The memory 810 and the memory controller 820 may store data or read stored data.

The memory 810 may include at least any one of nonvolatile memory devices to which the semiconductor devices or stacked semiconductor packages in accordance with the embodiments are applied, and the memory controller 820 may control the memory 810 to read stored data or store data, in response to a read/write request from a host 830.

While various embodiments have been described above, it will be understood to those skilled in the art that the embodiments described are by way of example only. Accordingly, semiconductor devices and stacked semiconductor packages with an extended bandwidth described herein should not be limited based on the described embodiments.

What is claimed is:

1. A semiconductor device comprising:
a semiconductor chip; and
a plurality of chip pads disposed on the semiconductor chip in a second horizontal direction perpendicular to a first horizontal direction,
wherein the plurality of chip pads comprises:
a first chip pad connected to a wire extending in the first horizontal direction, when seen from the top; and
a second chip pad connected to a diagonal wire, the diagonal wire extending in a direction at an angle to the first and second horizontal directions, when seen from the top,
wherein the width of the first chip pad in the second horizontal direction is smaller than the width of the second chip pad in the second horizontal direction.

2. The semiconductor device of claim 1, wherein the length of the second chip pad in the first horizontal direction is equal to the width of the second chip pad in the second horizontal direction.

3. The semiconductor device of claim 1, wherein the length of the first chip pad in the first horizontal direction is equal to the length of the second chip pad in the first horizontal direction.

4. The semiconductor device of claim 1, further comprising a third chip pad disposed on the semiconductor chip not connected to a wire,
wherein the width of the third chip pad in the second horizontal direction is smaller than the width of the second chip pad in the second horizontal direction, and the length of the third chip pad in the first horizontal direction is smaller than the length of the second chip pad in the first horizontal direction.

5. A stacked semiconductor package comprising:
a substrate; and
a plurality of semiconductor chips stacked over the substrate, each having a pad unit in which a first chip pad and a second chip pad are disposed, and offset from each other in a first horizontal direction such that the pad units are exposed,
wherein the first chip pads of the semiconductor chips are connected to a wire extending in the first horizontal direction, when seen from the top, and one or more of the second chip pads of the semiconductor chips are connected to a diagonal wire extending in a direction at angles to the first horizontal direction and a second horizontal direction perpendicular to the first horizontal direction, when seen from the top,
wherein the width of the first chip pad in the second horizontal direction is smaller than the width of the second chip pad in the second horizontal direction.

6. The stacked semiconductor package of claim 5, wherein the substrate comprises:
a first bonding finger disposed in a line with the first chip pads of the semiconductor chips in the first horizontal direction, and connected to the straight wire; and
a second bonding finger located not disposed in a line with the second chip pads of the semiconductor chips in the first horizontal direction, and connected to the diagonal wire.

7. The stacked semiconductor package of claim 5, wherein the length of the second chip pad in the first horizontal direction is equal to the width of the second chip pad in the second horizontal direction.

8. The stacked semiconductor package of claim 5, wherein the length of the first chip pad in the first horizontal direction is equal to the length of the second chip pad in the first horizontal direction.

9. The stacked semiconductor package of claim 5, wherein each of the plurality of semiconductor chips comprises a third chip pad having no wire connected thereto,
wherein the width of the third chip pad in the second horizontal direction is smaller than the width of the second chip pad in the second horizontal direction, and the length of the third chip pad in the first horizontal direction is smaller than the length of the second chip pad in the first horizontal direction.

10. The stacked semiconductor package of claim 9, wherein the third chip pad comprises a test pad coupled to test equipment during a test of the semiconductor chips.

11. The stacked semiconductor package of claim 5, wherein the plurality of semiconductor chips are divided into a plurality of channel groups, and the second chip pads comprise chip pads for signal transmission and are allocated to the respective channel groups.

12. The stacked semiconductor package of claim 5, wherein the first chip pad comprises an input/output pad through which data are inputted/outputted.

13. The stacked semiconductor package of claim 5, wherein the first chip pad comprises a supply voltage pad to which a supply voltage is inputted or a ground voltage pad to which a ground voltage is inputted.

14. The stacked semiconductor package of claim 5, wherein the first chip pad comprises a command input pad to which a command is inputted or an address input pad to which an address is inputted.

15. The stacked semiconductor package of claim 5, wherein each of the plurality of semiconductor chips comprises a fourth chip pad disposed in the pad unit,
wherein the fourth chip pad of each of the plurality of semiconductor chips is connected to the second chip pad of another of the plurality of semiconductor chips through the diagonal wire.

16. The stacked semiconductor package of claim 15, wherein the length of the fourth chip pad in the first horizontal direction is equal to the length of the second chip pad in the first horizontal direction, and the width of the fourth chip pad in the second horizontal direction is equal to the width of the second chip pad in the second horizontal direction.

* * * * *